United States Patent
Xu

(10) Patent No.: US 8,046,396 B2
(45) Date of Patent: Oct. 25, 2011

(54) RESIDUAL FOURIER-PADDING INTERPOLATION FOR INSTRUMENTATION AND MEASUREMENT

(75) Inventor: Fang Xu, Newton, MA (US)

(73) Assignee: Teradyne, Inc., North Reading, MA (US)

( * ) Notice: Subject to any disclaimer, the term of this patent is extended or adjusted under 35 U.S.C. 154(b) by 976 days.

(21) Appl. No.: 11/962,262

(22) Filed: Dec. 21, 2007

(65) Prior Publication Data

US 2008/0243983 A1    Oct. 2, 2008

Related U.S. Application Data

(60) Provisional application No. 60/908,549, filed on Mar. 28, 2007.

(51) Int. Cl.
*G06F 7/38* (2006.01)
*G06F 17/17* (2006.01)
(52) U.S. Cl. .................... 708/209; 708/313
(58) Field of Classification Search .......... 708/290, 708/313
See application file for complete search history.

(56) References Cited

U.S. PATENT DOCUMENTS

| | | | |
|---|---|---|---|
| 6,882,947 B2 * | 4/2005 | Levin | 702/77 |
| 7,295,509 B2 * | 11/2007 | Laroia et al. | 370/208 |
| 2005/0047518 A1 * | 3/2005 | Auer | 375/267 |
| 2008/0198374 A1 * | 8/2008 | Desbiens et al. | 356/300 |

OTHER PUBLICATIONS

Richard G. Lyons, "Time-Domain Interpolation by Frequency-Domain ZeroPadding," 1999, published on line at http://www.dspguru.com/howto/tech/zeropad.htm.

* cited by examiner

*Primary Examiner* — Chuong D Ngo
(74) *Attorney, Agent, or Firm* — Bruce D. Rubenstein

(57) ABSTRACT

A technique for interpolating a series of samples includes constructing a mathematical model of the series that describes its large signal behavior. The model is subtracted from the original series to yield a residue. A discrete Fourier transform (DFT) is taken of the residue, and the DFT is zero-padded. An inverse DFT of the padded result yields an interpolated residue, which is then added back to the mathematical model to construct an interpolated version of the series of samples. Using this technique, accurate interpolation can generally be attained even when the series of samples is not coherently sampled.

20 Claims, 5 Drawing Sheets

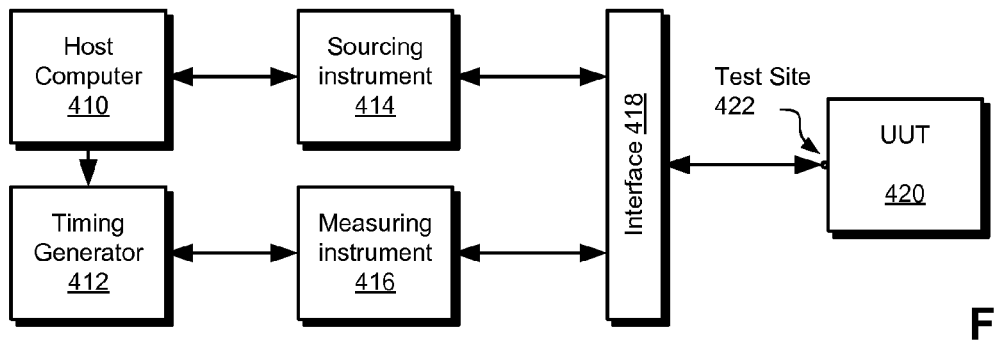
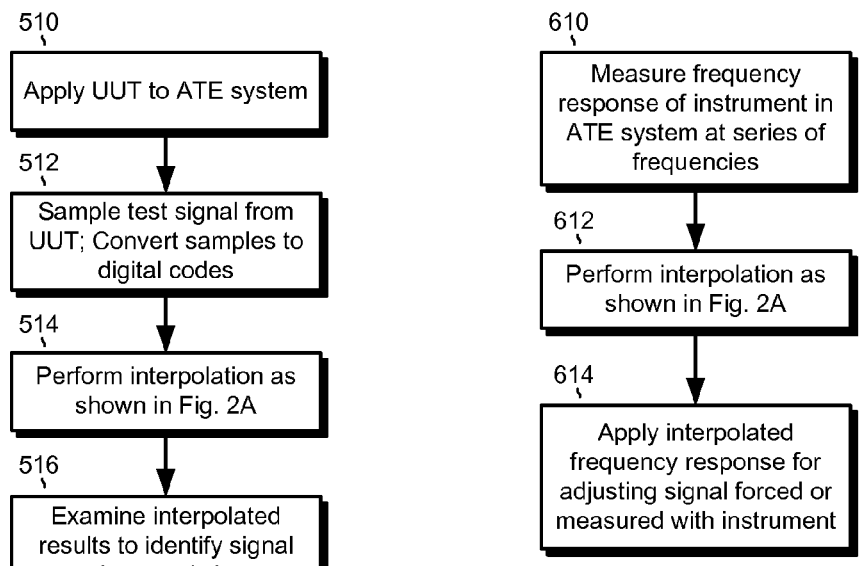
Fig. 4
Fig. 5
Fig. 6

RESIDUAL FOURIER-PADDING INTERPOLATION FOR INSTRUMENTATION AND MEASUREMENT

CROSS-REFERENCES TO RELATED APPLICATIONS

This application claims priority to U.S. provisional patent application No. 60/908,549, filed Mar. 28, 2007.

STATEMENT REGARDING FEDERALLY SPONSORED RESEARCH OR DEVELOPMENT

Not Applicable.

NAMES OF PARTIES TO A JOINT RESEARCH AGREEMENT

Not Applicable

REFERENCE TO A "SEQUENCE LISTING," A TABLE, OR A COMPUTER PROGRAM LISTING APPENDIX

Not Applicable.

BACKGROUND OF THE INVENTION

1. Field of the Invention

This invention relates generally to interpolation of uniformly sampled data, and, more particularly, to interpolation of sampled data acquired from electronic signals for instrumentation and measurement.

2. Description of Related Art

Interpolation is a commonly used technique for estimating signal levels in gaps that fall between discretely sampled values. Consider a series of sampled values $x(n)$ that represent an electronic signal $x(t)$ sampled at a rate $F_S$.

Various methods have been used to estimate the level of $x(t)$ between samples. One technique is to construct straight lines between consecutive samples, or simply to "connect the dots." Values that fall between samples can be computed by linear estimation.

More sophisticated techniques involve connecting adjacent samples with second, third, or higher order polynomials. These methods take into account not only the samples being connected, but also neighboring samples. Interpolation using polynomials provides smoother, more continuous results than straight line interpolation.

Yet another method involves the use of the Discrete Fourier transform (DFT). A DFT is taken of the sampled signal, $x(n)$, to yield a discrete Fourier series, $X(m)$. The series $X(m)$ has a length equal to $F_S$ and has Hermitian symmetry. The series $X(m)$ is expanded in its space, creating a void in that space directly after the value corresponding to $F_S/2$, the Nyquist rate. Zeros are inserted into that void, and the series $X(m)$ is padded with zeros. An inverse DFT is then taken of the zero-padded $X(m)$, to yield an interpolated sequence, $x'(n)$. If the original series $x(n)$ consists of N samples, and K zeroes are added to $X(m)$, the interpolated sequence $x'(n)$ consists of N+K samples, K more than the original series.

FIG. 1 shows an example of this type of interpolation. Graph 110 shows a sampled series, $x(n)$, consisting of 64 samples. A DFT is taken of $x(n)$ to produce $X(m)$. Graph 112 shows the magnitude of $X(m)$. The graph 112 reveals two frequency components within the Nyquist rate (m=1 to 32), a lower frequency component 120 and a higher frequency component 122. Above the Nyquist rate (m=33 to 64), the spectrum repeats in reverse order, with component 124 corresponding to component 122 and component 126 corresponding to component 120.

The DFT sequence $X(m)$ is then zero-padded. As shown in graph 114, zeros 130 are inserted immediately after the $32^{nd}$ sample of $X(m)$, placing them precisely in the middle of the sequence. Values of $X(m)$ greater than Nyquist are simply shifted to the right. In this example, 192 zeros are added to $X(m)$ to create a sequence $X'(m)$ of 256 values, 4 times longer than the original sequence.

An inverse DFT is then taken of $X'(m)$ to produce an interpolated series, $x'(n)$. The interpolated series $x'(n)$ is shown in graph 116. It can be seen that $x'(n)$ represents the original series, $x(n)$, but with four times as many data points. With significant added detail, the wave shape of graph 116 stands out very clearly.

Interpolation using this zero-padding, DFT technique provides nearly perfect results assuming the signal $x(t)$ is periodic and band limited to the Nyquist rate. An arbitrarily large number of zeros can be added to provide any desired level of interpolated fidelity.

Zero-padding, DFT interpolation is clearly an effective technique. We have recognized, however, that its accuracy breaks down under certain conditions. First, the technique only works for periodic signals. Non-periodic signals are not amenable to Fourier analysis. Along a similar line, the technique is accurate only for signals that are coherent. As is known, signals are "coherent" when each of their frequency components completes exactly an integer number of cycles within the sampling interval. If an input signal is not coherent, i.e., if it completes only a partial cycle of any component, an error called "leakage" arises. Leakage causes erroneous broadening of spectral lines, as well as other false structure. In the interpolation context, leakage causes errors in $X(m)$ and therefore in $X'(m)$, which in turn causes the interpolated signal, $x'(n)$, to inaccurately represent the original sequence, $x(n)$.

The need for interpolation of sampled data commonly arises in the context of Instrumentation and Measurement (I&M), including automatic test equipment (ATE). I&M systems are customarily employed for digitizing and analyzing electronic signals, and are typically supplied with numerous digital signal processing (DSP) engines, which are well-suited for performing DFTs. Zero-padding, DFT interpolation is therefore a natural fit for these test systems. However, signals sampled with I&M systems are often not periodic or coherent.

It would be desirable to find a way to use zero-padding, DFT interpolation in I&M applications for signals that are not periodic, without significantly compromising accuracy.

BRIEF SUMMARY OF THE INVENTION

According to an embodiment of the invention, a technique for transforming an electronic analog signal into an interpolated, digital signal includes discretely sampling the electronic analog signal to produce a series of analog samples and converting the series of analog samples into a series of digital samples representative of the series of analog samples. The method further includes constructing a mathematical model of the sampled signal that approximately describes the series of digital samples. The model is subtracted from the series of digital samples to yield a residue signal. A discrete Fourier transform (DFT) is taken of the residue signal, and the DFT is zero-padded. An inverse DFT of the padded signal yields an interpolated residue signal, which is then added back to the mathematical model to construct the interpolated, digital signal.

According to another embodiment, the above-described technique is used in automatic test equipment (ATE) for testing electronic units under test. A unit under test (UUT) is connected to a test system, and the test system is made to apply one or more stimuli to the UUT to induce it to produce an output signal. The output signal is sampled and interpolated by the ATE, using the above-described technique. The interpolated signal is examined for one or more signal characteristics, such as overshoot, undershoot, and/or slew rate. It is then compared with predetermined test limits. If the signal characteristic(s) falls within the test limit(s), the device is passed on for further processing. Otherwise, the device may be discarded or graded according to its actual performance.

According to a further embodiment, interpolation is used for calibrating an instrument in an automatic test system. The instrument is exercised and a data set of frequency response values is produced. The above-described interpolation technique is then applied to the data set to produce an interpolated data set. The interpolated data set can then be used to adjust the gain and/or phase of the instrument to effect calibration.

According to yet another embodiment, an apparatus for representing an electronic analog signal in digital form includes means for sampling the electronic analog signal to produce a sampled signal, and means for constructing a mathematical model that approximately describes the sampled signal. The apparatus further includes means for subtracting the mathematical model from the sampled signal, to yield a residue signal, means for computing a DFT (Discrete Fourier Transform) of the residue signal. The apparatus still further includes means for zero-padding the DFT of the residue signal to yield a padded residue signal, means for computing an inverse DFT of the padded residue signal to produce an interpolated residue signal, and means for adding the interpolated residue signal to the mathematical model to produce an interpolated version of the sampled signal.

According to still another embodiment, an apparatus for interpolating a data set includes a modeling unit for storing a mathematical model that approximately describes the data set. A first summer has a first input for receiving the data set and a second input coupled to the modeling unit. The first summer further has an output for providing a residue indicative of a difference between the data set and the mathematical model. A DFT unit is coupled to the first summer, for computing a DFT (Discrete Fourier Transform) of the residue, and a zero-padding unit is coupled to the DFT unit, for padding the DFT of the residue to yield a padded residue. The apparatus further includes an IDFT unit, coupled to the zero-padding unit, for computing an inverse DFT of the padded residue to produce an interpolated residue and a second summer having a first input coupled to the IDFT unit, a second input coupled to the modeling unit, and an output for providing a sum of the interpolated residue and the mathematical model.

BRIEF DESCRIPTION OF THE SEVERAL VIEWS OF THE DRAWINGS

Novel features of the invention will become apparent from consideration of the ensuing description and drawings, in which—

FIG. 4 is a simplified block diagram of automatic test equipment (ATE), with which the interpolation process of FIG. 2A may be conducted;

FIG. 5 is a flowchart showing a process according to an embodiment of the invention for applying the interpolation process of FIG. 2A to measuring a test signal generated by a unit under test (UUT) in an ATE system; and FIG. 6 is a flowchart showing a process according to an embodiment of the invention for applying the interpolation process of FIG. 2A to measuring the frequency response of an instrument in an ATE system.

DETAILED DESCRIPTION OF THE INVENTION

As used throughout this document, the words "comprising," "including," and "having" are intended to set forth certain items, steps, elements, or aspects of something in an open-ended fashion. Unless a specific statement is made to the contrary, these words do not indicate a closed list to which additional things cannot be added.

The embodiments disclosed herein exploit the linear nature of the Fourier transform. They also exploit the fact that the inverse Fourier transform precisely recovers the original signal, if that signal is band-limited and coherently sampled. In the discrete-time context, these two properties can be summarized as follows:

$$DFT(a(n)+b(n))=DFT(a(n))+DFT(b(n)); \text{ and}$$

$$DFT^{-1}(DFT(x(n)))=x(n).$$

Consider a situation in which component a(n) can be coherently sampled within the sampling interval, but component b(n) is not periodic or cannot be sampled coherently. Component a(n), if considered alone, can surely be recovered and interpolated without leakage or aliasing errors; however, component b(n) cannot.

We have recognized that interpolation of the overall signal can still proceed as follows. Component b(n), which is not necessarily periodic or coherently sampled, is mathematically modeled to produce a model, B. The model, B, is then subtracted from the sampled signal x(n) to isolate a(n), the component which is periodic and coherently sampled. The component a(n) is herein referred to as the "residue" or "residue signal." Interpolation then proceeds on the residue signal in the usual manner. First, a DFT is taken of a(n) to produce A(m). Next, A(m) is zero-padded to produce A'(m). Last, an inverse DFT is taken of A'(m) to produce the interpolated result, a'(n).

Values B are calculated for each value of a'(n). These values are added back to a'(n) to assemble a complete, interpolated signal, x'(n). Interpolation of x(n) is thus achieved despite the fact that x(n) as a whole is not periodic and coherently sampled.

The component a(n) is described above as periodic and coherently sampled. We have recognized, however, that this need not be the case. If the residue signal, a(n), is small in relation to the component b(n), then it contributes proportionally little to the overall interpolated result, x'(n). Moreover, any leakage errors that arise from incoherently sampling the residue signal are generally 20 db or more smaller than the frequency peaks of the residue signal. Since the leakage errors are a small part of a small signal, they can as a practical matter be ignored in many applications.

Figure 1:
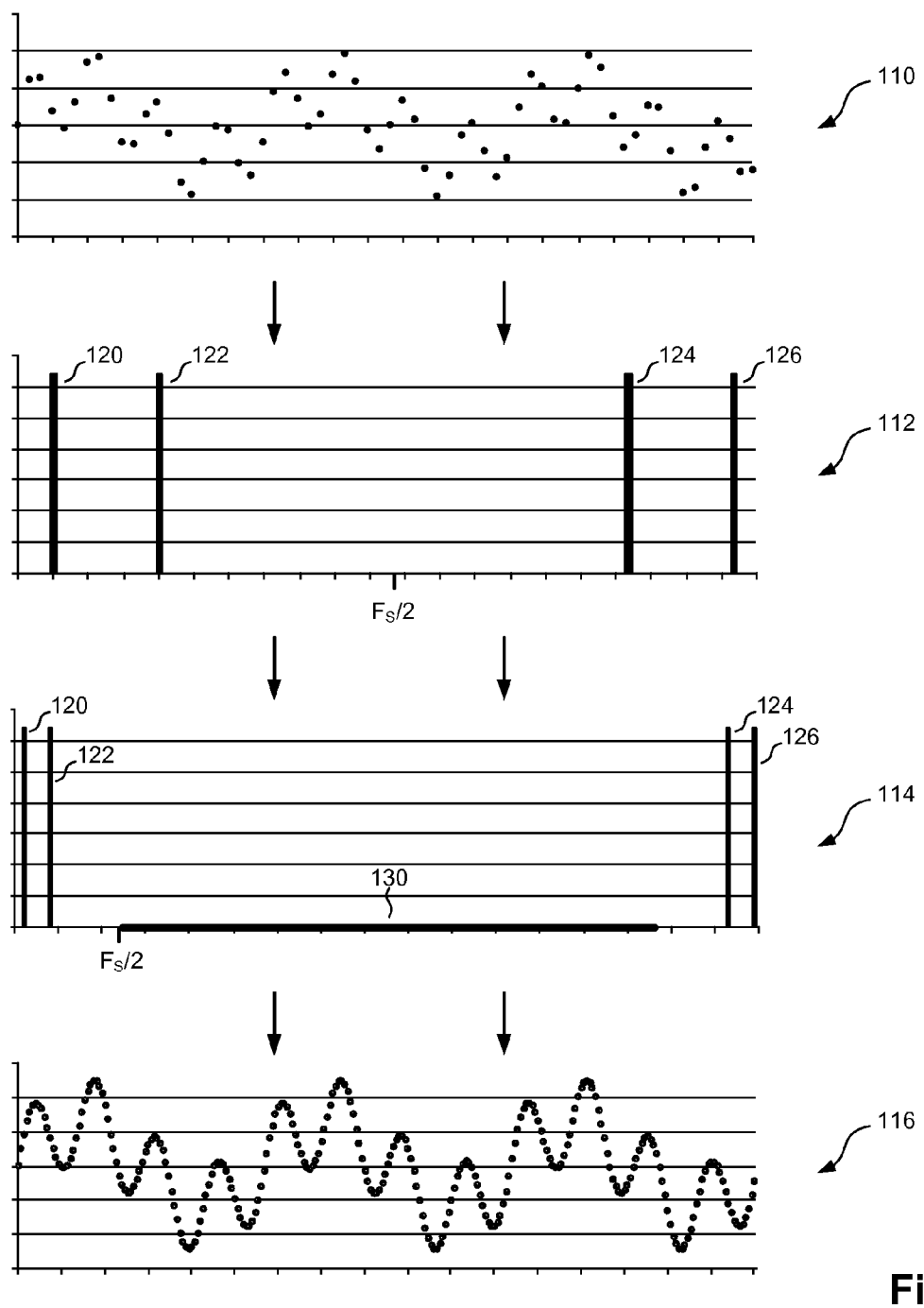
FIG. 1 is a series of graphs showing a process according to the prior art for interpolating a sampled signal using zero-padding and the DFT (discrete Fourier transform)
Figure 2A:
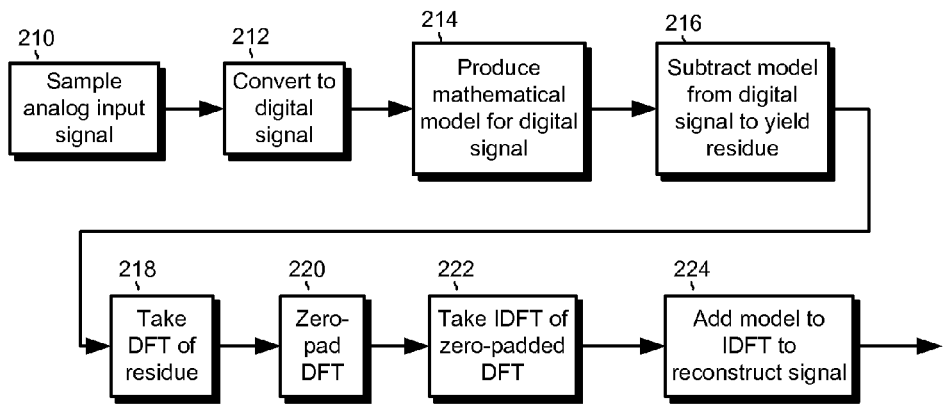
FIGS. 2A and 2B are, respectively, a flowchart showing a process according to an embodiment of the invention for interpolating a sampled signal and an apparatus according to an embodiment of the invention for sampling and interpolating an analog signal.

FIG. 2A shows a summary of this process. At step 210, an analog input signal x(t) is sampled at a sampling rate $F_S$ to produce a series of discrete samples. The analog samples are converted to a series of digital codes x(n) at step 212. At step 214, the digital signal x(n) is examined, and a mathematical model B is generated. The mathematical model B approximates the signal x(n) and may contain frequency components that are non-periodic or non-coherent. At step 216, the mathematical model is subtracted from x(n), to yield a residue signal, a(n). At step 218, a DFT is taken of a(n) to produce A(m). The DFT is zero-padded at step 220, to produce A'(m), and an inverse DFT is taken of A'(m) at step 222, to produce the interpolated residue signal, a'(n). The mathematical model B is added to the residue signal at step 224 to reconstruct the overall, interpolated signal, x'(n).

The mathematical model, B, is preferably a mathematical function, such as a line, parabola, or polynomial, or a combination of any number of these. Preferably, the mathematical model has values that exist over the entire sampling interval. Minimally, the model B should have values for every sample at the original sampling rate and for every sample at the higher, interpolated sampling rate.

The mathematical model should preferably follow the large signal behavior of the sampled signal. Thus, if the sampled signal has a ramp shape, the mathematical model is preferably linear. If the sampled signal has a triangular shape, the mathematical model should preferably be a triangle. The objective is to model the large signal changes in the samples so that the residue is relatively small.

The mathematical model can be produced manually, on a case-by-case basis. A user inspects the samples and attempts to fit a simple function or combination of functions to the samples. Alternatively, a software program can be used to inspect the samples and provide a model that fits the large signal behavior of the samples. As yet another alternative, a user employs a software program to assist in manually producing the mathematical model.

Figure 2B:
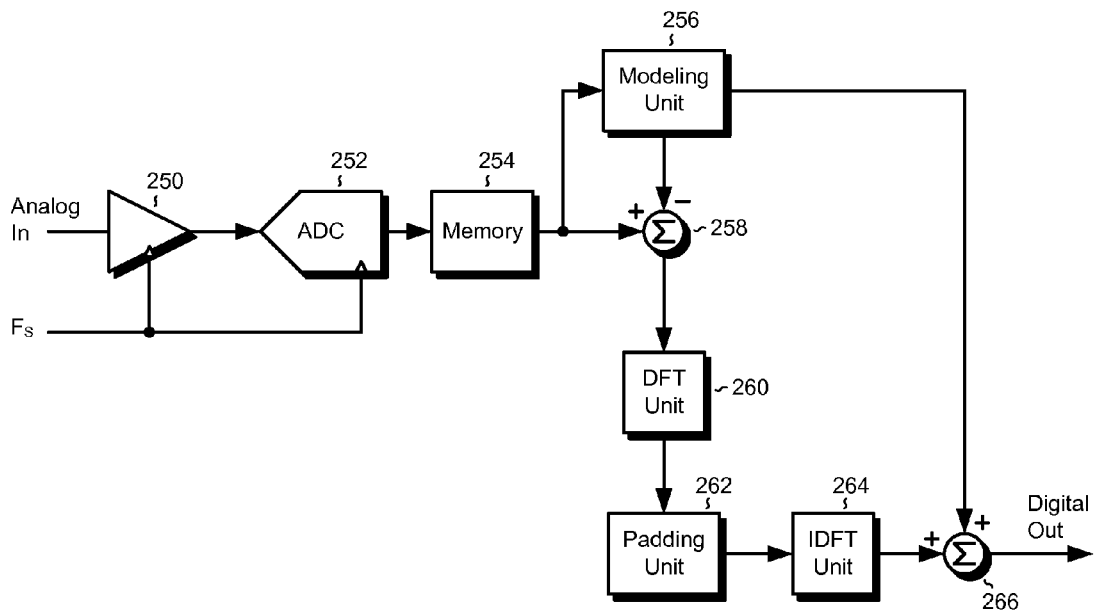

FIG. 2B shows an example of an apparatus suitable for performing the process shown in FIG. 2A. The apparatus includes a sampler 250, an ADC (analog-to-digital converter) 252, a memory 254, a modeling unit 256, a DFT unit 260, a padding unit 262, and IDFT unit 264, and first and second summers 258 and 266. The sampler 250 receives an analog input signal. At regular intervals determined by a sampling rate, $F_S$, the sampler acquires a sample of the analog input signal and holds that sample at its output. The ADC 252 receives each sample and converts it to a digital code. The memory 254 then receives and stores the digital codes. A user (or software program, or both) examines the digital codes stored in the memory 254 and creates a mathematical model that approximates the digital codes. The mathematical model is then stored in the modeling unit 256. The digital codes are then output, preferably one at a time, from the memory 254 to a first input of the summer 258. Simultaneously, the modeling unit 256 outputs codes corresponding to the mathematical model to a second input of the summer 258. The summer 258 computes a difference code that corresponds to the difference between each sample from the memory 254 and each value from the modeling unit 256, and outputs the difference code to a DFT unit 260. The DFT unit 260 accumulates the difference codes to construct a residue signal and performs a discrete Fourier transform on the residue signal. The padding unit 262 receives the DFT and adds a sequence of zeroes. A zero-padded DFT is then output to the IDFT unit 264, which performs an inverse DFT to produce the interpolated residue signal. The padding unit 262 feeds this signal to a first input of the second summer 266. Meanwhile, the modeling unit 256 feeds modeled codes to a second input of the second summer 266. The output of the summer 266 then provides the overall interpolated result.

The sampler 250 is preferably a sample-and-hold circuit or track-and-hold circuit. The ADC may be any suitable type, such as a flash converter, successive-approximation converter, sigma-delta converter, or any other type. The memory 254, modeling unit 256, DFT unit 260, padding unit 262, IDFT unit 264, and summers 258 and 266 are preferably implemented with dedicated hardware such as a single FPGA (field-programmable gate array) or ASIC (application-specific integrated circuit). Alternatively, they may be provided with multiple FPGAs and/or ASICs, with other types of hardware, or with one or more computer processors (such as DSP processors) running software or firmware for carrying out the respective functions.

Figure 3A:
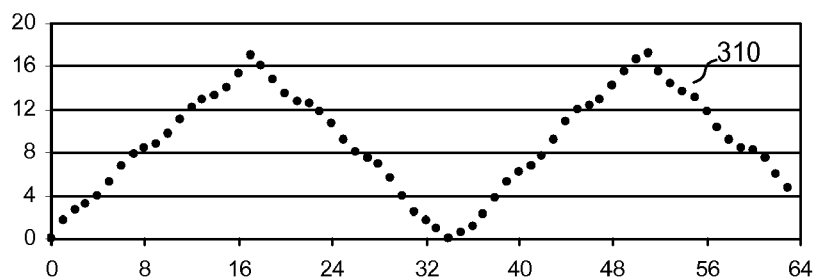
FIGS. 3A through 3G are a series of graphs showing a interpolation of a sampled signal using the process shown in FIG. 2A.
Figure 3B:
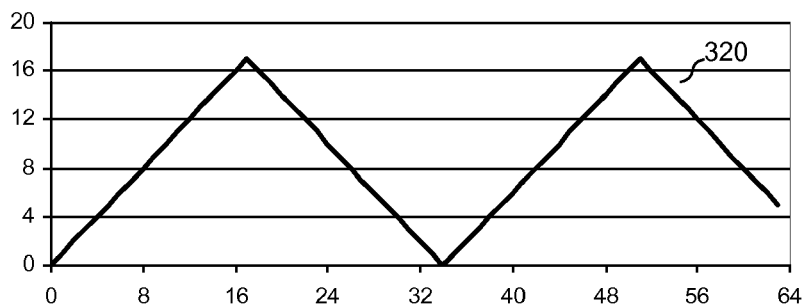

FIGS. 3A-3G show various steps of the interpolation process. Samples 310 of FIG. 3A show the original sample set of 64 samples. A mathematical model 320 is created, to describe the large signal behavior of the samples 310. In this case, the model 320 is a triangle wave having frequency and amplitude that generally match the samples 310.

Figure 3C:
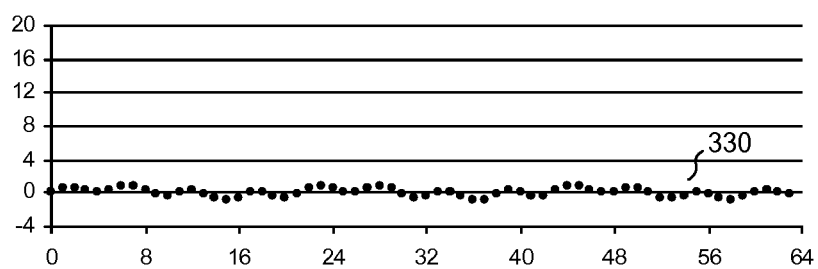

As shown in FIG. 3C, samples 330 represent the difference between the samples 310 and the model 320, i.e., the residue signal. For each sample 310, the corresponding value of the triangle wave 320 is subtracted to produce the residue 330.

Figure 3D:
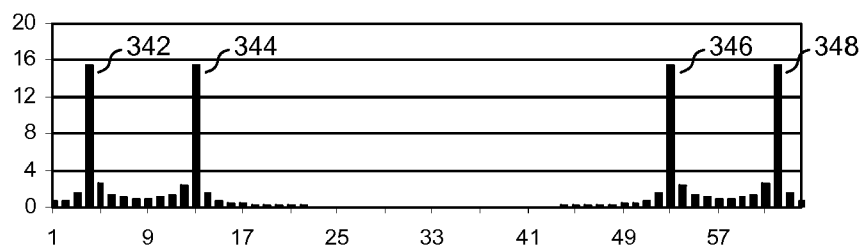

FIG. 3D shows a DFT of the residue. Two frequency components, 342 and 344, are revealed, along with their mirror images, 346 and 348.

Figure 3E:
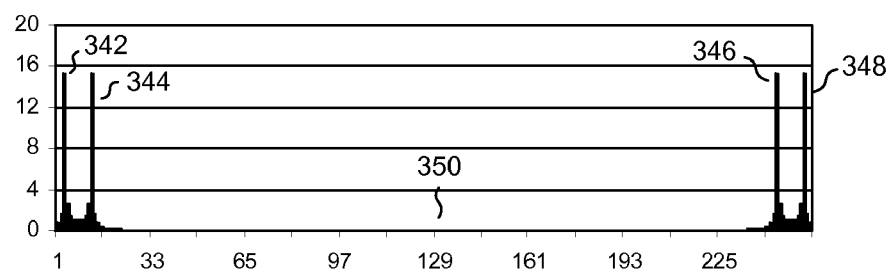
Figure 3F:
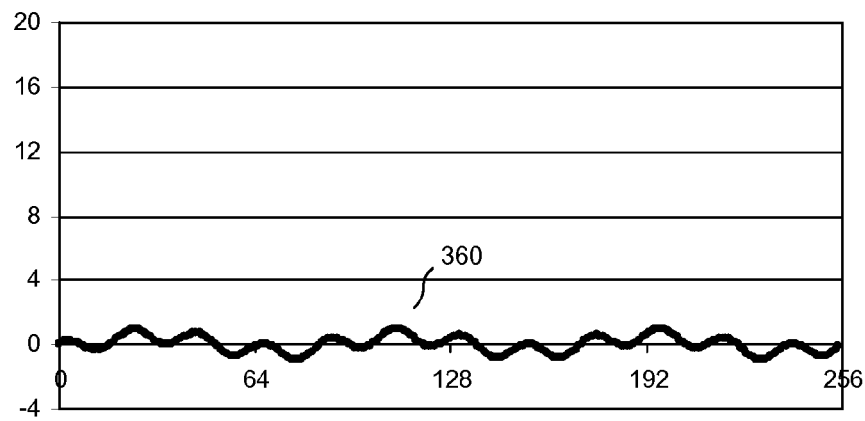

FIG. 3E shows the DFT after padding with 192 zeros 350, to make a total of 256 points. The inverse DFT results are shown in FIG. 3F, wherein samples 360 represent the interpolated residue signal.

Figure 3G:
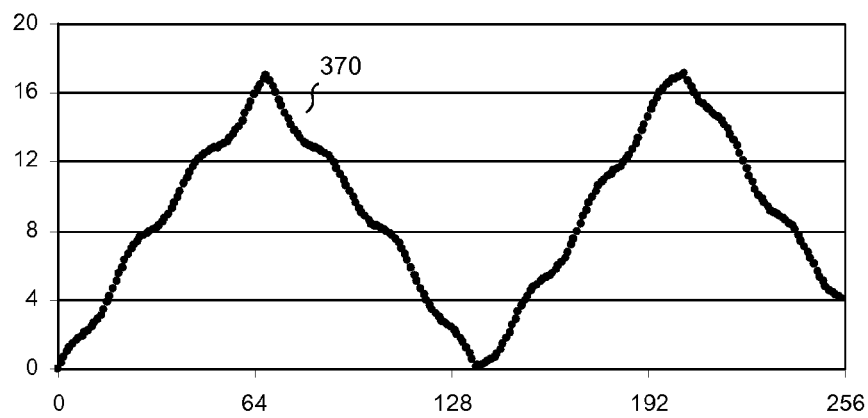

Finally, in FIG. 3G, the interpolated residue signal 360 is added back to the model 320, to construct an interpolated version 370 of the sampled signals.

The interpolation technique described herein has direct applications to I&M systems and automatic test equipment (ATE). FIG. 4 is a block diagram of a simplified ATE system. As shown, the system includes a host computer 410, a timing generator 412, one or more sourcing instruments 414, one or more measuring instruments 416, and an interface 418. The ATE system is configurable for testing a unit under test, or "UUT" 420.

The various portions of the conventional ATE system are well known in the art. The host computer runs a test program for controlling the timing generator 412, instruments 414 and 416, and interface 418, for controllably applying stimuli to the UUT 420, and for monitoring responses from the UUT with precise timing.

FIG. 5 shows a process for testing a device with an ATE system such as that shown in FIG. 4, using the interpolation technique herein described. At step 510, a UUT, such as a semiconductor device or other electronic device or assembly to be tested, is applied to the ATE system. At step 512, a measuring instrument 416 samples a test signal from the UUT. Interpolation as described herein is performed at step 514. At step 516, the interpolated results are examined to identify signal characteristics, such as overshoot, undershoot, and slew rate. At step 518, the characteristics are compared with one or more test limits, to determine whether the interpolated signal meets the limits. A passing or failing result is determined at step 520. If the test passes, the UUT is moved forward for further processing. If the test fails, the UUT may be discarded, or additional testing may be performed to identify its level of performance. The additional testing may include grading the UUT based on its performance, and labeling and selling the device according to its tested grade.

By interpolating the sampled test signal, additional detail about the test signal is supplied that improves test quality. Particularly when testing slew rate, overshoot, undershoot, and other signal characteristics, interpolation provides additional signal fidelity that allows margins of error to be reduced when testing. Testing can often be performed to tighter tolerances than could be used without interpolation.

Another application of the interpolation technique disclosed herein to ATE is shown in FIG. 6. At step 610, the frequency response of an instrument is measured. A series of points is acquired, each point describing a gain and/or phase at a particular frequency. The overall series of points is then interpolated (step 612). Subsequently, when the instrument is operated for testing devices, values are corrected according to the interpolated results (step 614).

If the instrument is a sourcing instrument, such as a continuous wave frequency synthesizer or arbitrary waveform generator, then correction entails programming higher or lower values of amplitude to compensate for variations in frequency response. For example, if the interpolated frequency response shows a dip at a certain frequency, a higher value of amplitude can be programmed at that frequency to compensate for the dip. A similar correction can be made for phase. If signals at a certain frequency are delayed or advanced in time, the instrument can be programmed to advance or delay its output signal correspondingly to compensate for the phase error.

Correction according to this technique is not limited to the output of the instrument itself. Referring back to FIG. 4, the instrument is normally connected to the UUT 420 at a test site 422, which is typically beyond the interface 418 and at the end of a series of cables and connectors. Frequency response of the instrument is typically measured at the test site 422, and the instrument is subsequently programmed to compensate for errors as they appear at the test site 422.

If the instrument is a measuring instrument, such as a digitizer, measured values can be compensated for instrument errors by boosting or lowering them based upon the measured frequency response. For instance, if a digitizer has a known dip in its frequency response at a particular frequency, values read back for signals at that frequency can be boosted in proportion to the measured dip, thus compensating for the error. As with the sourcing instrument, frequency response and subsequent correction are typically performed relative to the test site 422. Accurate correction can thus be achieved for signals originating from the UUT 420.

Note that the examples of FIG. 6 perform interpolation on frequency response data. One can regard the frequency response data as consisting of frequency samples acquired from a continuous-frequency signal. It should be understood that the interpolation technique disclosed herein works just as well in the frequency domain as it does in the time domain.

The embodiments disclosed herein allow zero-padded interpolation to be conducted on sampled signals, even when they are not periodic or coherent. The embodiments have practical applications especially to I&M, and particularly to ATE, where the need for interpolation of sampled data commonly arises and where the hardware required to perform the desired interpolation is commonly found.

Having described certain embodiments, numerous alternative embodiments or variations can be made. For example, interpolation techniques have been described herein that involve sampling analog signals in the time domain or the frequency domain. These are merely examples, however, of ways in which the invention may be practiced. Interpolation in the manner described can be performed on literally any set of data points, regardless of the source. Although sampling analog signals and converting signals from analog to digital form are part of certain embodiments, they are not required for all embodiments. The interpolation technique described herein can be used with any type of data, whether it be sampled or not and whether it be converted or not. It can be used in any application in which a series of data points is to be connected smoothly. Other possible uses include audio and video processing, to improve apparent resolution.

Those skilled in the art will therefore understand that various changes in form and detail may be made to the embodiments disclosed herein without departing from the scope of the invention.

What is claimed is:

1. A method of transforming an electronic analog signal into an interpolated, digital signal, comprising:
    (A) discretely sampling the electronic analog signal to produce a series of analog samples;
    (B) converting the series of analog samples into a series of digital samples representative of the series of analog samples;
    (C) constructing a mathematical model that approximately describes the series of digital samples;
    (D) subtracting the mathematical model from the series of digital samples, to yield a residue signal;
    (E) computing a DFT (Discrete Fourier Transform) of the residue signal;
    (F) zero-padding the DFT to yield a padded residue signal;
    (G) computing an inverse DFT of the padded residue signal to produce an interpolated residue signal; and
    (H) adding the interpolated residue signal to the mathematical model to produce the interpolated, digital signal.

2. A method as recited in claim 1, wherein the step (B) of converting is performed by an analog-to-digital converter.

3. A method as recited in claim 1, performed by an automatic test system under the direction of a test program for testing a unit under test, and further comprising using the interpolated, digital signal to determine whether the unit under test passes or fails the test program.

4. A method as recited in claim 1, wherein the mathematical model represents large signal behavior of the sampled signal.

5. A method as recited in claim 1, wherein the step of constructing the mathematical model comprises manually estimating the mathematical model.

6. A method as recited in claim 1, wherein the step of constructing the mathematical model comprises analyzing the series of digital samples with a software program.

7. A method as recited in claim 1, wherein the step of constructing the mathematical model comprises estimating the series of digital samples with one or more straight lines, parabolas, and/or polynomials.

8. A method of testing a UUT (Unit Under Test) in an ATE system, comprising:
    (A) connecting the UUT to an interface of an automatic test system;
    (B) electronically stimulating the UUT to produce an output signal;
    (C) sampling the output signal;
    (D) interpolating the sampled output signal;

(E) comparing at least one signal characteristic of the interpolated sampled output signal with a predetermined test limit; and
(F) indicating a passing or failing test result based upon the comparing step,
wherein the step of interpolating the sampled output signal includes—
constructing a mathematical model that approximately describes the sampled output signal
subtracting the mathematical model from the sampled output signal, to yield a residue signal;
computing a DFT (Discrete Fourier Transform) of the residue signal;
zero-padding the DFT of the residue signal to yield a padded residue signal;
computing an inverse DFT of the padded residue signal to produce an interpolated residue signal; and
adding the interpolated residue signal to the mathematical model to produce the interpolated sampled output signal.

9. A method as recited in claim 8, further comprising discarding or grading the UUT according to the passing or failing result.

10. A method as recited in claim 7, wherein the at least one signal characteristic includes overshoot, undershoot, or slew rate.

11. A method as recited in claim 7, wherein the mathematical model comprises one or more straight lines, parabolas, or polynomials.

12. A method of calibrating an instrument in an automatic test system, comprising:
(A) exercising the instrument at each of a plurality of different frequencies;
(B) measuring a response of the instrument at each of the plurality of frequencies to produce a sampled data set;
(C) interpolating the sampled data set; and
(D) adjusting the gain and/or phase of the instrument responsive to the interpolated data set,
wherein the step of interpolating the sampled data set includes—
constructing a mathematical model that approximately describes the sampled data set,
subtracting the mathematical model from the sampled data set, to yield a residue;
computing a DFT (Discrete Fourier Transform) of the residue;
zero-padding the DFT of the residue to yield a padded residue;
computing an inverse DFT of the padded residue to produce an interpolated residue; and
adding the interpolated residue to the mathematical model to produce an interpolated version of the sampled data set.

13. A method as recited in claim 12, wherein the instrument is a sourcing instrument.

14. A method as recited in claim 13, wherein:
the instrument is connected to the UUT at a test site;
the step (A) of exercising comprises inducing the instrument to produce the plurality of different frequencies; and
the step (B) of measuring comprises measuring at the test site.

15. A method as recited in claim 13, wherein the sourcing instrument is one of a continuous wave frequency synthesizer and an arbitrary waveform generator.

16. A method as recited in claim 12, wherein the instrument is a measuring instrument.

17. A method as recited in claim 16, wherein:
the instrument is connected to the UUT at a test site;
the step (A) of exercising comprises applying signals to the instrument from the test site; and
the step of (B) of measuring comprises inducing the instrument to make a measurement at each of the plurality of frequencies.

18. A method as recited in claim 17, wherein the measuring instrument is a digitizer.

19. An apparatus for representing an electronic analog signal in digital form, comprising:
means for sampling the electronic analog signal to produce a sampled signal;
means for constructing a mathematical model that approximately describes the sampled signal;
means for subtracting a mathematical model from the sampled signal, to yield a residue signal;
means for computing a DFT (Discrete Fourier Transform) of the residue signal;
means for zero-padding the DFT of the residue signal to yield a padded residue signal;
means for computing an inverse DFT of the padded residue signal to produce an interpolated residue signal; and
means for adding the interpolated residue signal to the mathematical model to produce an interpolated version of the sampled signal.

20. An apparatus for interpolating a data set, comprising:
a modeling unit for storing a mathematical model that approximately describes the data set;
a first summer having a first input for receiving the data set, a second input coupled to the modeling unit, and an output for providing a residue indicative of a difference between the sampled signal and the mathematical model;
a DFT unit, coupled to the first summer, for computing a DFT (Discrete Fourier Transform) of the residue;
a zero-padding unit, coupled to the DFT unit, for padding the DFT of the residue to yield a padded residue;
an IDFT unit, coupled to the zero-padding unit, for computing an inverse DFT of the padded residue to produce an interpolated residue; and
a second summer having a first input coupled to the IDFT unit, a second input coupled to the modeling unit, and an output for providing a sum of the interpolated residue and the mathematical model.

* * * * *